(12) United States Patent
Xiao et al.

(10) Patent No.: US 7,608,487 B2
(45) Date of Patent: Oct. 27, 2009

(54) B-STAGEABLE UNDERFILL ENCAPSULANT AND METHOD FOR ITS APPLICATION

(75) Inventors: Allison Yue Xiao, Belle Mead, NJ (US); Quinn K. Tong, Belle Mead, NJ (US); Bodan Ma, Racine, WI (US); Gyanendra Dutt, Piscataway, NJ (US)

(73) Assignee: Henkel AG & Co. KGaA, Düsseldorf (DE)

( * ) Notice: Subject to any disclaimer, the term of this patent is extended or adjusted under 35 U.S.C. 154(b) by 502 days.

(21) Appl. No.: 11/284,219

(22) Filed: Nov. 21, 2005

(65) Prior Publication Data

US 2006/0125119 A1 Jun. 15, 2006

Related U.S. Application Data

(63) Continuation-in-part of application No. 10/084,873, filed on Mar. 1, 2002, now abandoned.

(51) Int. Cl.
*H01L 21/00* (2006.01)
(52) U.S. Cl. .................. 438/127; 257/E21.502
(58) Field of Classification Search .................. 438/127
See application file for complete search history.

(56) References Cited

U.S. PATENT DOCUMENTS

| 5,855,821 | A | 1/1999 | Chau et al. |
| 6,121,689 | A | 9/2000 | Capote et al. |
| 6,132,646 | A | 10/2000 | Zhou et al. |
| 6,180,696 | B1 | 1/2001 | Wong et al. |
| 6,194,788 | B1 | 2/2001 | Gilleo et al. |
| 2001/0034382 | A1 | 10/2001 | Sumita et al. |

FOREIGN PATENT DOCUMENTS

| JP | 10 084073 | 6/1983 |
| JP | 58103525 | 6/1983 |
| JP | 62081416 A | 4/1987 |
| JP | 04248827 | 9/1992 |
| JP | 07224153 | 8/1995 |
| JP | 07224153 A | 8/1995 |
| JP | 10101906 A | 4/1998 |
| WO | WO97/07541 | 2/1997 |

OTHER PUBLICATIONS

Nadia Yala, et al., Characterization of Flip Chip Assembly Utilizing Wafer Applied Underfill, 0-7083-7430-4, 2002 IEEE, 2002 ECTC.
Shi, et al., Development of the Wafer Level Compressive-Flow—Underfill—Process, 1999 IEEE, XP002245856.

*Primary Examiner*—David A Zarneke

(57) ABSTRACT

A curable underfill encapsulant composition that is applied directly onto semiconductor wafers before the wafers are diced into individual chips. The composition comprises a thermally curable resin system comprising an epoxy resin, a phenol-containing compound such as phenol or phenolic resin, a solvent, an imidazole phosphate salt catalyst, inorganic fillers, fluxing agents, and optionally, wetting agents. Various other additives, such as defoaming agents, adhesion promoters, flow additives and rheology modifiers may also be added as desired. The underfill encapsulant is B-stageable to provide a coating on the wafer that is smooth, non-tacky and will allow the wafer to be cleanly diced into individual chips. A method for producing an electronic package containing the B-stageable material may also utilize an unfilled liquid curable fluxing material on the substrate to which the chip is to be attached.

6 Claims, 1 Drawing Sheet

Figure 1. DSC Curing Curves with different catalysts & loadings
(Formula A1-D2)
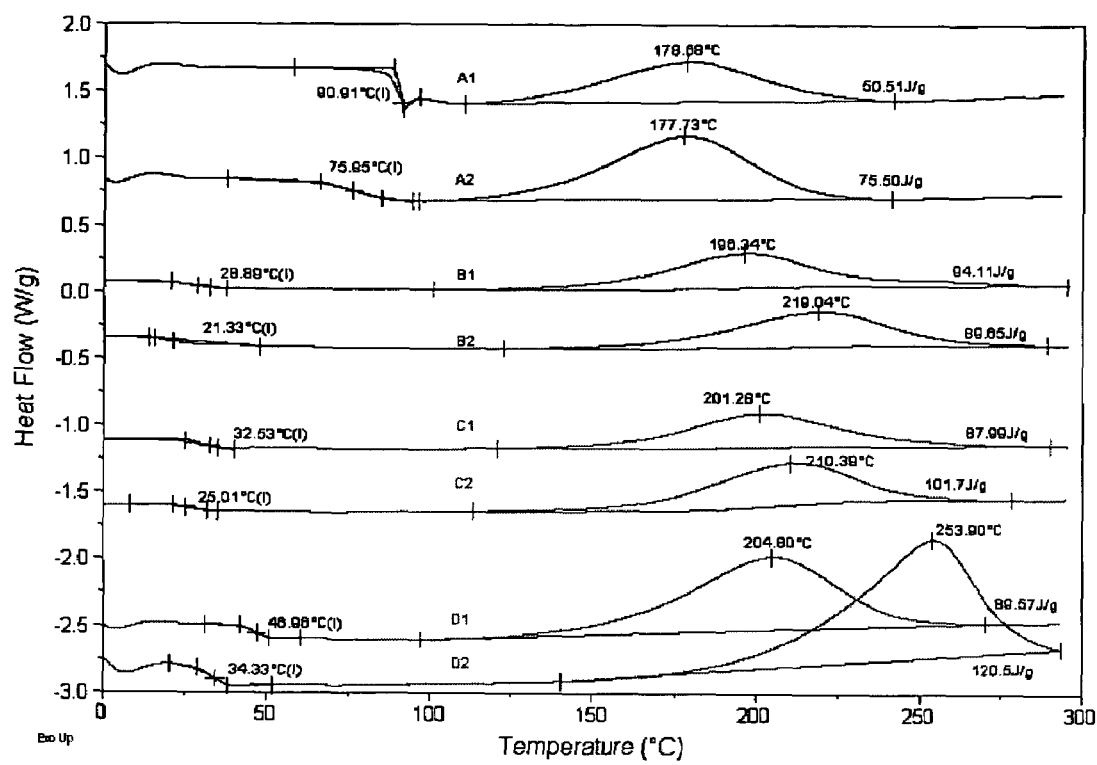

B-STAGEABLE UNDERFILL ENCAPSULANT AND METHOD FOR ITS APPLICATION

RELATED APPLICATIONS

The present application is a continuation-in-part application of U. S. patent application Ser. No. 10/084,873, filed Mar. 1, 2002 now abandoned.

FIELD OF THE INVENTION

The present invention is related to an underfill encapsulant and a method for its application to semiconductor wafers.

BACKGROUND OF THE INVENTION

This invention relates to underfill encapsulant compounds prepared from epoxies and phenolic resins to protect and reinforce the interconnections between an electronic component and a substrate in a microelectronic device. Microelectronic devices contain multiple types of electrical circuit components, mainly transistors assembled together in integrated circuit (IC) chips, but also resistors, capacitors, and other components. These electronic components are interconnected to form the circuits, and eventually are connected to and supported on a carrier or a substrate, such as a printed wire board. The integrated circuit component may comprise a single bare chip, a single encapsulated chip, or an encapsulated package of multiple chips. The single bare chip can be attached to a lead frame, which in turn is encapsulated and attached to the printed wire board, or it can be directly attached to the printed wire board. These chips are originally formed as a semiconductor wafer containing multiple chips. The semiconductor wafer is diced as desired into individual chips or chip packages.

Whether the component is a bare chip connected to a lead frame, or a package connected to a printed wire board or other substrate, the connections are made between electrical terminations on the electronic component and corresponding electrical terminations on the substrate. One method for making these connections uses polymeric or metallic material that is applied in bumps to the component or substrate terminals. The terminals are aligned and contacted together and the resulting assembly is heated to reflow the metallic or polymeric material and solidify the connection.

During its normal service life, the electronic assembly is subjected to cycles of elevated and lowered temperatures. Due to the differences in the coefficient of thermal expansion for the electronic component, the interconnect material, and the substrate, this thermal cycling can stress the components of the assembly and cause it to fail. To prevent the failure, the gap between the component and the substrate is filled with a polymeric encapsulant, hereinafter called underfill or underfill encapsulant, to reinforce the interconnect material and to absorb some of the stress of the thermal cycling.

Two prominent uses for underfill technology are for reinforcing packages known in the industry as chip scale packages (CSP), in which a chip package is attached to a substrate, and flip-chip packages in which a chip is attached by an array of interconnections to a substrate.

In conventional capillary flow underfill applications, the underfill dispensing and curing takes place after the reflow of the metallic or polymeric interconnect. In this procedure, flux is initially applied on the metal pads on the substrate. Next, the chip is placed on the fluxed area of the substrate, on top of the soldering site. The assembly is then heated to allow for reflow of the solder joint. At this point, a measured amount of underfill encapsulant material is dispensed along one or more peripheral sides of the electronic assembly and capillary action within the component-to-substrate gap draws the material inward. After the gap is filled, additional underfill encapsulant may be dispensed along the complete assembly periphery to help reduce stress concentrations and prolong the fatigue life of the assembled structure. The underfill encapsulant is subsequently cured to reach its optimized final properties.

Recently, attempts have been made to streamline the process and increase efficiency by coating the underfill encapsulant directly on the semiconductor wafer before the wafer is diced into individual chips. The coating procedure, which can be performed via various methods, including screen printing, stencil printing and spin coating, allows for a single application of underfill to a single semiconductor wafer that is later diced into a large number of individual chips.

In order to be useful as a wafer level underfill encapsulant, the underfill must have several important properties. First, the material must be easy to apply uniformly on the wafer so that the entire wafer has a consistent coating. The underfill encapsulant that is applied to the wafer must not interfere with the clean dicing of the wafer into individual chips. The underfill encapsulant must be B-stageable, which means that the underfill must be solidified after its placement on a wafer to provide a smooth, non-tacky coating with minimal residual solvent.

If the starting underfill material is a solid, the solid is dispersed or dissolved in a solvent to form a paste and the paste applied to the wafer. The underfill is then heated to evaporate the solvent, leaving a solid, but uncured, underfill on the wafer. If the starting underfill material is a liquid or paste, the underfill is dispensed onto the wafer and heated to partially cure it to a solid state.

The B-stage process usually occurs at a temperature lower than about 150° C. without prematurely curing the underfill encapsulant. The final curing of the underfill encapsulant must be delayed until after the solder fluxing (in the situation that solder is the interconnect material) and interconnection, which occurs at a temperature of 183° C. in the case of tin/lead eutectic solder and greater than 200° C. in the case of lead free solder. The final curing of the underfill should occur rapidly after the solder bump flow and interconnection. During this final attachment of the individual chips to a substrate, the underfill encapsulant must flow in order to enable fillet formation, flux the solder bumps, and provide good adhesion between the chip, or chip passivation layer, the substrate, or the solder mask, and the solder joints. In particular instances, it can be useful to provide an unfilled liquid curable fluxing material directly on the substrate to faciliate interconnection.

BRIEF DESCRIPTION OF THE FIGURE

FIG. 1 is DSC curing thermograms.

SUMMARY OF THE INVENTION

The invention relates to a curable B-stageable underfill encapsulant composition that is applied directly onto semiconductor wafers before the wafers are diced into individual chips. The composition comprises a thermally curable resin system comprising an epoxy resin, a phenol-containing compound, such as phenol or phenolic resin, a solvent, an imidazole-anhydride catalyst, inorganic fillers, and optionally, fluxing agents and/or wetting agents. Various other additives, such as defoaming agents, adhesion promoters, flow additives and rheology modifiers may also be added as desired. In an alternative embodiment, the imidazole-anhydride catalyst is replaced with an imidazole phosphate salt. The underfill encapsulant is B-stageable to provide a coating on the wafer that is smooth, non-tacky and will allow the wafer to be cleanly diced into individual chips. The individual chips are then attached directly to a substrate. In an alternative embodiment, an unfilled liquid curable fluxing material is applied directly to the substrate to promote interconnection with the chip.

DETAILED DESCRIPTION OF THE INVENTION

The resins used in the underfill encapsulant composition of the present invention are curable compounds, which means that they are capable of polymerization. As used in this specification, to cure will mean to polymerize, with cross-linking. Cross-linking, as understood in the art, is the attachment of two-polymer chains by bridges of an element, a molecular group, or a compound, and in general takes place upon heating.

Ingredients of the B-stageable underfill encapsulant composition of the present invention include a blend of one or more epoxy resins and a phenolic-containing compound, an imidazole-anhydride adduct which acts as a catalyst, one or more solvents, and an inorganic filler. In the alternative embodiment, the imidazole-anhydride adduct is replaced with an imidazole phosphate salt which acts as a catalyst. Optionally, fluxing agents, air release agents, flow additives, adhesion promoters, rheology modifiers, surfactants and other ingredients may be included. The ingredients are specifically chosen to obtain the desired balance of properties for the use of the particular resins. A solvent is chosen to dissolve the resin(s) and thus make the composition into a paste form with proper viscosity for application via spin coating, screen printing or stencil printing on the wafer. In the preferred embodiment, the composition contains an inorganic filler, a solvent, and is B-stageable, i.e., the composition is capable of an initial solidification that produces a, smooth, non-tacky coating on the semiconductor wafer. The B-stage solidification preferably occurs in at a temperature in the range of about 80° C. to about 160° C. After the B-stage process, a smooth, non-tacky solid coating is obtained on the wafer to ensure the clean dicing of the wafer into individual chips. The final, complete curing occurs at a second temperature, in the range of about 180° C., that is higher than the B-stage curing temperature. Generally, the final cure of the composition occurs after the formation of the interconnections. In the case of Pb/Sn eutectic solder, the formation of the interconnections occurs at a temperature above the melting point of the solder, which is 183° C. In the case of lead free solder, the formation of the interconnections occurs at a temperature of 217° C. for AgSnCu and 225° C. for AgCu solder alloy. A latent catalyst, the adduct of anhydride and imidazole or imidazole phosphate salt, is used in the composition to ensure the proper cure of the composition without interfering with the formation of the interconnection. The catalyst chosen must prevent any curing, other than some minimal pre-curing, during the B-stage and must ensure that no gelation occurs on the non-tacky surface formed after the B-stage. Preferably, the B-stage solidification occurs at a temperature of at least 30° C. less than the final cure temperature.

Examples of epoxy resins suitable for use in the present wafer level underfill composition include monofunctional and multifunctional glycidyl ethers of Bisphenol-A and Bisphenol-F, aliphatic and aromatic epoxies, saturated and unsaturated epoxies, or cycloaliphatic epoxy resins or a combination thereof. Examples of aliphatic epoxy include Flex Epoxy 1, with an epoxy equivalent weight (eew) of 341. Example of aromatic epoxies include RAS-1, with an eew of 86; RAS-5, with an eew of 122: and Flex Epoxy-3, with an eew of 433.

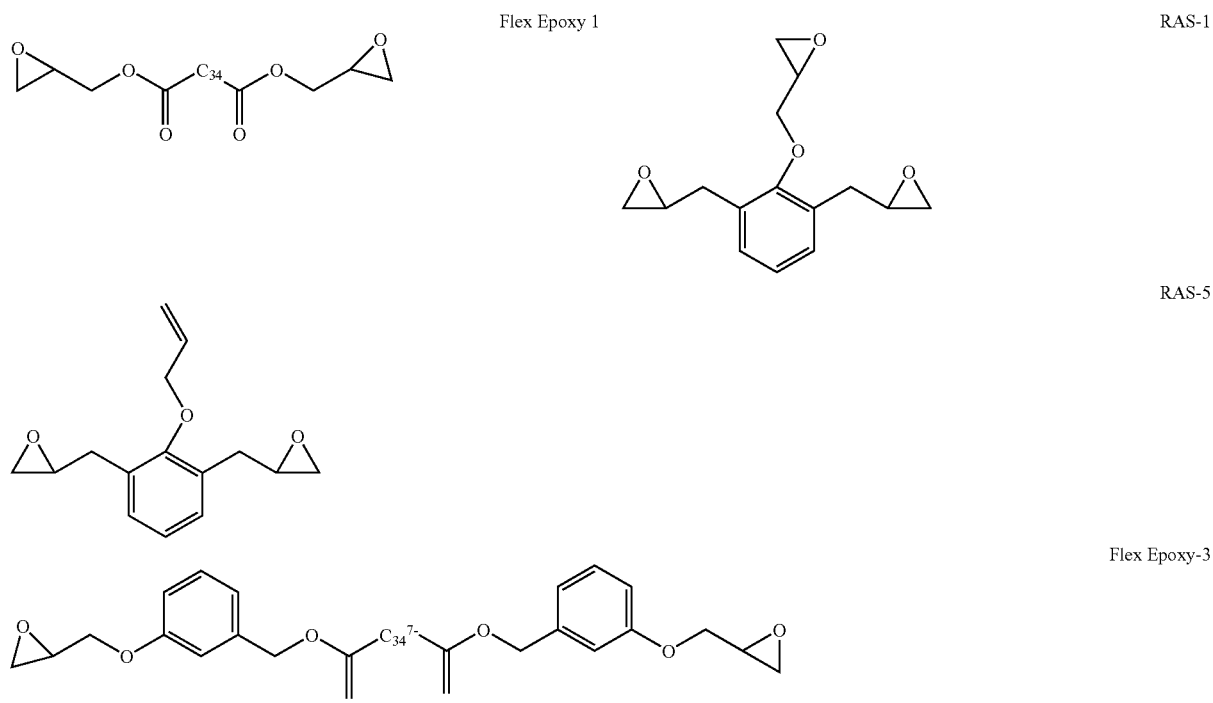

Example of unsaturated epoxy includes Cardolite NC513, with an eew of 341.

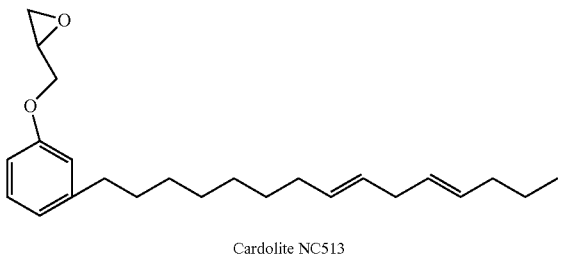

Cardolite NC513

Examples of non-glycidyl ether epoxides include 3,4-epoxycyclohexylmethyl-3,4-epoxycyclohexane carboxylate, which contains two epoxide groups that are part of the ring structures and an ester linkage, vinylcyclohexene dioxide, which contains two epoxide groups and one of which is part of the ring structure, 3,4-epoxy-6-methyl cyclohexyl methyl-3,4-epoxycyclohexane carboxylate and dicyclopentadiene dioxide.

Glycidyl ether epoxides are preferred in the invention, either separately or in combination with the non-glycidyl ether epoxides. A preferred epoxy resin of this type is bisphenol A resin. Another preferred epoxy resin is bisphenol F type resin. These resins are generally prepared by the reaction of one mole of bisphenol F epoxy resin and two moles of epichlorohydrin. A further preferred type of epoxy resin is epoxy novolac resin. Epoxy novolac resin is commonly prepared by the reaction of phenolic resin and epichlorohydrin. A preferred epoxy novolac resin is poly(phenyl glycidyl ether)-co-formaldehyde. Biphenyl type epoxy resin may also be utilized in the present invention. This type of resin is commonly prepared by the reaction of biphenyl resin and epichlorohydrin. Dicyclopentadiene-phenol epoxy resin, naphthalene resins, epoxy functional butadiene acrylonitrile copolymers, epoxy functional polydimethyl siloxane and mixtures thereof are additional types of epoxy resins which may be employed. Commercially available bisphenol-F type resins are available from CVC Specialty Chemicals, Maple Shade, N.J., under the designation 8230E (epoxy equivalent weight (eew) 164-176) and Resolution Performance Products LLC under the designation RSL1739 (eaw 185-192). Bisphenol-A type resin is commercially available from Resolution Technology as EPON 828 (eew 185-192), EPON 1001 (eew 525-550), EPON 1002 (eew 600-700) and a blend of bisphenol-A and bisphenol-F is available from Nippon Chemical Company under the designation ZX-1059 (eew 160-170). The resin commercially available from Vantico as XP71756.00 (eew 215-235) may also be utilized.

The desired phenol-containing compound is combined with the non-phenolic resin to produce the admixture. The phenol-containing compound is preferably phenol or phenolic resin and is chosen to provide a high glass transition temperature to the final composition. Especially preferred phenolic resins are phenolic novolac resins. Especially preferred phenol are bisphenol-A and dially bisphenoly A phenolic resins. Commercially available examples of phenolic novolac resins are Durez 12686 (Oxychem), HRJ-2190 (Schenectady), SP-560 (Schenectady), HRJ-2606 (Schenectady), HRJ -1166 (Schenectady), HRJ-11040 (Schenectady), HRJ-2210 (Schenectady), CRJ-406 (Schenectady), HRJ-2163 (Schenectady), HRJ-10739 (Schenectady), HRJ-13172 (Schenectady), HRJ-11937 (Schenectady), HRJ -2355 (Schenectady), SP-25 (Schenectady), SP-1068 (Schenectady), CRJ -418 (Schenectady), SP-1090 (Schenectady), SP-1077 (Schenectady). SP -6701 (Schenectady), HRJ-11945 (Schenectady), SP-6700 (Schenectady), HRJ-11995 (Schenectady), SP-553 (Schenectady), HRJ-2053 (Schenectady), SP-560 (Schenectady), BRWE5300 (Georgia-Pacific Resins), BRWE5555 (Georgia-Pacific Resins), and GP2074 (Georgia-Pacific Resins).

In addition to the resins, an imidazole-anhydride adduct or imidazole phosphate salt is included in the underfill composition as a catalyst. The adduct provides different properties to the underfill than the properties provided by the inclusion of imidazole and anhydride as separate components. The salt provides different properties to the underfill than the properties provided by the inclusion of imidazole and phosphoric acid as separate components. Preferred imidazoles that may be included in the adduct or salt include non-N-substituted imidazoles such as 2-phenyl-4-methyl imidazole, 2-ethyl-4-methyl-imidazole, 2-phenyl imidazole, 2-methyl imidazole and imidazole. Other useful imidazole components include alkyl-substituted imidazole, N-substituted imidazole, N-methylimidazole and mixtures thereof. The salt also comprises a phosphoric acid component A preferred catalyst is 2-phenylimidazole dihydrogen phosphate salt, commercially available from Air Products as AMICURE 2PIP. The adduct also comprises an anhydride component. The preferred anhydride is preferably a cycloaliphatic anhydride and most preferably pyromellitic dianhydride, commercially available as PMDA from Aldrich. Additional preferred anhydrides include methylhexa-hydro phthalic anhydride, commercially available as MHHPA from Lonza Inc. Intermediates and Actives. Other anhydrides that may be utilized include methyltetra-hydrophthalic anhydride, nadic methyl anhydride, hexa-hydro phthalic anhydride, tetra-hydro phthalic anhydride, phthalic anhydride, dodecyl succinic anhydride, bisphenyl dianhydride, benzophenone tetracarboxylic dianhydride, and mixtures thereof. A preferred catalyst is synthesized by combining 1 mole part 1,2,4,5-benzenetetracarboxylic dianhydride and 2 mole part 2-phenyl-4-methylimidazole. Both components are first dissolved in acetone under heat and when both are combined the imidazole-dianhydride salt forms as a precipitate. This preferred catalyst, in combination with an epoxy and solvent, produces an underfill having an onset curing temperature well above 160° C. and a cure peak temperature above 183° C. Further, the preferred catalyst provides improved latency as opposed to the use of just an imidazole A fluxing agent may also be incorporated into the underfill composition. The fluxing agent primarily removes metal oxides and prevents reoxidation. While many different fluxing materials may be employed, the fluxing agent is preferably chosen from the group carboxylic acids. These carboxylic acids include rosin gum, dodecanedioic acid (commercially available as Corfree M2 from Aldrich), adipic acid, sebasic acid, polysebasic polynhydride, maleic acid, tartaric acid, and citric acid. The flux agent may also be chosen from the group that includes alcohols, hydroxyl acid and hydroxyl base. Preferable fluxing materials include polyols such as ethylene glycol, glycerol, 3-[bis(glycidyl oxy methyl) methoxy]-1,2-propane diol, D-ribose, D-cellobiose, cellulose, 3-cyclohexene-1,1-dimethanol and similar materials. The strength of an acid is an important factor because the acid should be sufficiently strong to wash the oxides out of the solder and the substrate. Preferably, the $pK_a$ of the acid should be greater than 5. Stability of the acid at temperatures around 183° C. is important, and the acid should not decompose at temperatures lower than 183° C. As solder reflows at 183° C., a flux material that cannot withstand that temperature is unsuitable for the proper formulation.

A solvent is utilized to modify the viscosity of the composition. Preferably, the solvent will evaporate during the B-stage process which occurs at temperatures lower than about 150° C. Common solvents that readily dissolve the epoxy and phenolic resins, non-reactive, and with the proper boiling point ranging from 100° C. to 200° C. can be used for this application. Examples of solvents that may be utilized include ketones, esters, alcohols, ethers, and other common solvents that are stable and dissolve the epoxy and phenolic resins in the composition. Preferred solvents include γ-butyrolactone and propylene glycol methyl ethyl acetate (PG-MEA).

Inorganic fillers are utilized to control the coefficient of thermal expansion (CTE) of the composition. Preferably, the inorganic fillers will lower the CTE to a range of about 30 ppm which will aid in reducing the strain on the solder bumps during thermal cycling that is imposed by the CTE differences between the chip and the substrate. Examples of inorganic fillers that may be utilized include particles of vermiculite, mica, wollastonite, calcium carbonate, titania, sand, glass, fused silica, fumed silica, alumina, barium sulfate, and halogenated ethylene polymers, such as tetrafluoroethylene, trifluoro-ethylene, vinylidene fluoride, vinyl fluoride, vinylidene chloride, and vinyl chloride. A preferred inorganic filler is silica, commercially available under the trade name FUSOFE® from Admatechs.

Additional ingredients may be added to the underfill encapsulant to produce a composition with the desired properties. For example, monofunctional reactive diluents can incrementally delay the increase in viscosity without adversely affecting the physical properties of the cured underfill. Preferred diluents include p-tert-butyl-phenyl glycidyl ether, allyl glycidyl ether, glycerol diblycidyl ether, glycidyl ether of alkyl phenol (commercially available from Cardolite Corporation as Cardolite NC513), and Butanediodiglycidylether (commercially available as BDGE from Aldrich), although other diluents may be utilized. Surfactants may be utilized to aid in the prevention of process voiding during the flip-chip bonding process and subsequent solder joint reflow and material curing. Various surfactants which may be utilized include organic acrylic polymers, silicones, polyoxyethylene/polyoxypropylene block copolymers, ethylene diamine based polyoxyethylene/polyoxypropylene block copolymers, polyol-based polyoxyalkylenes, fatty alcohol-based polyoxyalkylenes, fatty alcohol polyoxyalkylene alkyl ethers and mixtures thereof. In addition, coupling agents, air release agents, flow additives, adhesion promoters and other ingredients may also be added as desired.

A preferred embodiment of the underfill encapsulant of the present invention comprises an admixture of at least one epoxy resin and at least one phenol/phenolic resin, an imidazole-anhydride adduct as a catalyst, a fluxing agent, solvent, inorganic filler and other ingredients as desired. The resin admixture will comprise in the range of about 0.1 wt % to about 99.9 wt % of the epoxy resin and about 0.1 to about 99.9 wt % of the phenolic resin. Preferably, the admixture will be comprised of in the range of about 40 wt % to about 95 wt % of the epoxy resin and about 5 to about 60 wt % of the phenol/phenolic resin. The admixture will comprise in the range of about 20 wt % to about 80 wt % of the underfill composition. An imidazole-anhydride adduct is also added as a catalyst. The adduct comprises in the range of about 0.01 wt % to about 10 wt % of the underfill composition and preferably about 0.1 wt % to about 5 wt % of the composition. Optionally, a fluxing agent is added comprising in the range of about 0.5 wt % to about 20 wt % of the composition and preferably in the range of about 1 wt % to about 10 wt % of the composition. In addition, the composition contains up to about 70 wt % of filler content and up to 60 wt % of solvent(s). Finally, optional ingredients such as surfactants, air release agents, flow additives, rheology modifiers, and adhesion promoters may be added to the composition in the range of about 0.01 wt % to about 5 wt % of the composition.

A further preferred embodiment of the underfill encapsulant of the present invention comprises an admixture of at least one epoxy resin and at least one phenol/phenolic resin, an imidazole phosphate salt as a catalyst, a fluxing agent, solvent, inorganic filler and other ingredients as desired. The resin admixture will comprise in the range of about 0.1 wt % to about 99.9 wt % of the epoxy resin and about 0.1 to about 99.9 wt % of the phenolic resin. Preferably, the admixture will be comprised of in the range of about 40 wt % to about 95 wt % of the epoxy resin and about 5 to about 60 wt % of the phenol/phenolic resin. The admixture will comprise in the range of about 20 wt % to about 80 wt % of the underfill composition. An imidazole phosphate salt is also added as a catalyst. The imidazole phosphate salt comprises in the range of about 0.01 wt % to about 10 wt % of the underfill composition and preferably about 0.1 wt % to about 5 wt % of the composition. Optionally, a fluxing agent is added comprising in the range of about 0.5 wt % to about 20 wt % of the composition and preferably in the range of about 1 wt % to about 10 wt % of the composition. In addition, the composition contains up to about 70 wt % of filler content and up to 60 wt % of solvent(s). Finally, optional ingredients such as surfactants, air release agents, flow additives, rheology modifiers, and adhesion promoters may be added to the composition in the range of about 0.01 wt % to about 5 wt % of the composition.

To utilize the B-stageable underfill composition, it is first applied directly onto a semiconductor wafer or individual chip via screen printing, spin coating or stencil printing. The wafer or chip having the coating is heated to an initial, B-stage temperature and the composition is B-stage solidified. Preferably, this results in a coating that is smooth and non-tacky. In the case of a wafer, the wafer is diced into individual chips. The chips having the B-staged composition are placed on a substrate with the B-staged composition adjacent to the substrate and the entire assembly is heated to a temperature of approximately 183° C. (in the case that lead/tin solder is utilized). This second heating causes the formation of interconnections between the substrate and the chip.

In an alternative embodiment, a composition comprising an unfilled liquid curable fluxing material comprising an epoxy resin, a phenolic-containing compound and an imidazole/anhydride adduct or an imidazole phosphate salt is applied directly to the substrate prior to placement of the chip. After the underfill is B-stage solidified on the wafer and the wafer is diced into individual chips, the chip is placed on the substrate with the B-staged material adjacent to and in contact with the unfilled liquid curable material. The unfilled liquid curable material facilitates improved solder fluxing and interconnections between the substrate and the individual chips. As shown in Examples 7-9, when the composition of the alternative embodiment is placed on a substrate and a chip having the B-stageable composition is placed onto the substrate, a superior interconnect is formed after the completion of the reflow process.

The invention may be better understood by reference to the following examples:

EXAMPLE 1

An underfill encapsulant composition was manufactured comprising 50 parts each of EPON 826 (Shell Epoxy Resins) and HRJ2190 (Schenectady International) which were blended together with 53 parts of propylene glycol ethyl methyl acetate (PGMEA—Aldrich Chemical). The mixture was heated to 143° C. for 5 hours and 30 minutes. The resulting homogeneous blend was cooled to 25° C. After cooling, 108 parts of FUSOFE (Admatechs), 0.5 parts of BYK-W 9010 (BYK-Chemie), 0.5 parts of A-187 (Silquest), 1.8 parts of vinylmethyl siloxane-dimethylsiloxane copolymer (VDT-131 from Gelest, Inc.), and 0.4 parts of 2-phenyl-4-methyl imidazole (2P4MZ)/pyromellitic dianhydride (PMDA) adduct were added. The formulation was then dispersed in a Double Planetary Ross mixer for six hours. The mixed underfill material was bubble free, did not trap air on slow shearing, and had a viscosity of 30,000 cP (30 Pa's) at a shear rate of 1 $s^{-1}$. The underfill material was then dispensed on glass cover slips (25 mm×25 mm) by a stenciling process, to produce a 110 micron thick coating. The coated slips were then placed on a hot plate that was preheated to 135° C. and B-staged for 15 minutes. After the B-stage process, the coatings were found to be smooth, non-tacky and void free. The glass transition temperature of the coating was found to be around 46° C. by DSC. The glass transition temperature was within the desired range for providing clean dicing of an wafer that is coated with a B-staged underfill composition.

EXAMPLE 2

Underfill compositions were formulated according to the method set out in Example 1. The material was dispensed on a piece of OSP Cu finished FR4 board. Eutectic solder balls of 20 mil diameter were placed in the material. Excess material was sheared off by placing a 25 mm×25 mm glass cover slip on top of the material and pushing the glass slip into contact with the solder balls. In this way, the thickness of the material was controlled to within 20 mil. After removing the slip, the assembly was placed on a vacuum oven at 120° C. and B-staged for 30 minutes. After the B-stage process, a smooth, void-free, and non-tacky coating was obtained. Since solvent was evaporated during the B-staging and the coating was about 20% thinner, the solder balls in the coating were protruding from the coating. After this specimen was placed face down on a 1'×3' glass slide, the entire assembly was placed on a hot plate that was preheated to 160° C. After two minutes, this assembly was transferred to another hot plate that was preheated to 240° C. for one more minute. Checking from the glass slide, it was observed that the solder balls wetted the glass slide and enlarged in area. This solder ball enlargement suggested the encapsulant material was not prematurely cured and did not interfere with solder spreading and interconnect formation.

EXAMPLE 3

To test the workability of the underfill material in an attachment method that also involves an unfilled epoxy/phenolic material, an underfill composition was formulated according to the process of Example 1. The material was then placed on 25 mm×25 mm glass cover slips and eutectic solder balls were placed on the coating which was then B-staged. An unfilled composition was also prepared. The unfilled epoxy/phenolic composition was formulated with 70 parts of RSL1739, 10 parts of Flex-1 and 10 parts of phenolic HRJ1166. These three resins were blended together without solvent and 0.5 parts of 2P4MZ/PMDA imidazole/anyhydride adduct and 10 parts of Corfree M2 were added. The resulting material was liquid at room temperature and had a viscosity of around 6,500 cP (6.5 Pa-s) at 1 $s^{-1}$. A drop of the unfilled composition was placed on a piece of FR-4 board with Cu finish. A 25 mm×25 mm cover slip was coated with the filled epoxy/phenolic material, eutectic solder balls were placed in the coating and the assembly was B-staged. The cover slip containing the B-staged epoxy/phenolic coating was placed face down on the substrate, which had a drop of the unfilled composition on it. The above assembly was then put on a hot plate that had been preheated to 240° C. Fluxing of the solder and the interconnection with the substrate was observed. The flow of the solder before the curing of the unfilled composition was also ensured by the latent curing provided by the 2P4MZ/PMDA adduct. The unfilled composition also flowed and formed a complete fillet around the cover slip before curing. The approach utilized in this example is compatible with the current surface mount technology. The surface tension of the unfilled composition helped to hold and self-align the cover slip during the reflow process. At the same time, the liquid form of unfilled composition provided better fillet formation, wetting and adhesion between the cover slip and the substrate. This approach, utilizing two different materials for the chip and the substrate, also precluded the potential problem of air and filler trapping on the solder bump and wafer.

EXAMPLE 4

Five formulations of the underfill encapsulant composition were prepared according to the method of Example 1 as shown in Table 1. To determine the effect of the ratio and presence of the catalyst, the loading of the 2P4MZ/PMDA adduct was varied and in one formulation the catalyst was 2P4MZ instead of the adduct.

TABLE 1

Epoxy/Phenolic Formulations with Different Catalysts

|    | EPON 826 | HRJ 2190 | 2P4MZ/ PMDA | 2P4MZ | Peak Curing Temp (° C.) | Enthalpy Of Curing (J/g) |
|----|----------|----------|-------------|-------|-------------------------|--------------------------|
| A1 | 50       | 50       | 0.5         |       | 172.9                   | 33.2                     |
| A2 | 50       | 50       |             | 0.5   | 157.8                   | 31.1                     |
| B1 | 50       | 50       | 0.4         |       | 181.0                   | 53.6                     |
| B2 | 50       | 50       | 0.25        |       | 190.3                   | 70.5                     |
| B3 | 50       | 50       | 0.1         |       | 203.4                   | 90.4                     |

As shown in Table 1, the use of the 2P4MZ/PMDA adduct shifts the curing of the epoxy-phenolic system to temperatures at least 15° C. higher than those of the formulation using 2P4MZ. This temperature shift provides a longer time window for the eutectic solder to flux and form interconnections before the underfill has cured. When a solder-bumped chip coated with formulation A1 was passed through the reflow process, fluxing, reflow and interconnection of the solder bumps to the substrate were established. In the case of the bumped chips coated with formulation A2, the coating cured before the flow of the solder. Further, Table 1 illustrates that when the loading of the 2P4MZ/PMDA adduct is reduced, the curing is delayed to higher temperatures and the enthalpy of curing is also much higher. This suggests that any pre-curing during the B-stage can be minimized and the latent curing of the catalyst can be exploited more efficiently at lower catalyst loadings. The desired composition catalyst loadings, and thus different curing profiles, may be adjusted and chosen for different types of solder.

EXAMPLE 5

Two underfill encapsulants were formulated as shown in Table 2. The ratios of the epoxy and phenolic resins were varied to determine the effect of the ratio on the curing of the system.

TABLE 2

DSC Curing Results for Resin/Adduct

|    | EPON 826 | HRJ 2190 | 2P4MZ/ PMDA | Peak Curing Temp (° C.) | Enthalpy Of Curing (J/g) |
|----|----------|----------|-------------|-------------------------|--------------------------|
| C1 | 90       | 10       | 0.5         | 167.2                   | 107.7                    |
| C2 | 80       | 20       | 0.5         | 166.7                   | 219.9                    |

Table 2 illustrates the effect of the blend of the epoxy/phenolic ratio on the enthalpy of curing. When the ratio of epoxy/phenolic is reduced from 9:1 to 4:1, the enthalpy of curing is more than doubled. This doubling may be attributed to more functional groups per weight of the phenolic resin. Three additional underfill encapsulants were formulated according to the method described in Example 1. As shown in Table 3, the proportions of the resins and adduct were changed. The coatings of these formulations were B-staged and their curing profiles were studied in DSC.

TABLE 3

DSC Curing Results for B-staged Coatings

|    | EPON 826 | HRJ 2190 | 2P4MZ/ PMDA | Peak Curing Temp. (° C.) | Enthalpy Of Curing (J/g) |
|----|----------|----------|-------------|--------------------------|--------------------------|
| D1 | 60       | 40       | 0.5         | 176.6                    | 55.3                     |
| D2 | 57       | 43       | 0.5         | 175.5                    | 50.6                     |
| D3 | 50       | 50       | 0.5         | 172.9                    | 33.2                     |

As shown in Table 3, with an increase in phenolic resin from 40 parts to 50 parts, the curing peak shifts to slightly lower temperatures. More importantly, the enthalpy of curing is decreased significantly. This result is the opposite of the result recorded for non-B-staged formulations and suggests that the higher phenolic content accelerates curing and results in substantial pre-curing during the B-stage. Thus, it is possible to tailor the epoxy/phenolic ratio and the catalyst content to achieve the desired amount of cure during the B-stage. The premature curing during the B-stage should be minimized since it greatly affects the flow properties during the attachment process. For example, the coating from formulation D3 had very poor substrate wettability and flow during the attachment process. Thus, the result was poor attachment between the chip and the substrate and little to no fillet formation around the package. The formulation D1 had lesser B-stage solidification and had good flow properties when attached to the substrate by heat and pressure. This formulation wetted the substrate completely and formed a complete fillet.

EXAMPLE 6

Two underfill encapsulant formulations were made according to the procedure set out in Example 1. To determine the effect of a fluxing agent on the composition, rosin gum was added to one of the formulations, as set out in Table 4.

TABLE 4

DSC Curing Results with/without Fluxing Agent

|    | EPON 826 | HRJ 2190 | 2P4MZ/ PMDA | Rosin Gum | Peak Curing Temp (° C.) | Enthalpy Of Curing (J/g) |
|----|----------|----------|-------------|-----------|-------------------------|--------------------------|
| E1 | 50       | 50       | 0.5         |           | 172.9                   | 33.2                     |
| E2 | 50       | 50       | 0.5         | 5         | 174.3                   | 68.4                     |

As shown in Table 4, the addition of the rosin gum as a fluxing agent raises the curing peak to slightly higher temperatures. At the same time, the enthalpy of curing is also increased. The acid-based fluxing agent has the effect of retarding the solidification of the coating during the B-stage.

EXAMPLE 7

An underfill encapsulant composition was formed via the method of Example 1. The encapsulant was coated on a 25 mm×25 mm glass cover slip and eutectic solder balls were placed on the coating. The coating was B-stage solidified at 135° C. for 15 minutes. After the B-stage, the coatings were smooth, non-tacky and void free. The glass transition temperature of the coating was found to be around 46° C. by DSC. For the purposes of this Example, this first composition will be referred to as Material A.

An unfilled liquid curable flux material was separately formulated with 90 parts of epoxy RSL1739 and 10 parts of phenolic HRJ1166. The two resins were blended together without solvent. 0.5 parts of the 2P4MZ and PMDA adduct and 10 parts of the fluxing agent Corfree M2 were added. The resulting material was a liquid at room temperature and had a viscosity of around 10,000 cP. For the purposes of this Example, this second composition will be referred to as Material B.

A drop of Material B was placed on a piece of FR-4 board acting as a substrate. The glass coverslip coated with B-staged solid Material A was placed face down on the substrate, so that Materials A and B were in contact with each other. The entire assembly was then placed on a hot plate that had been preheated to 240° C. After the heating, it was observed that the areas of the solder balls increased, indicating solder fluxing and interconnect formation. Also, after the reflow process a complete fillet was observed around the cover slip.

EXAMPLE 8

This Example was conducted to determine the adhesion of packages assembled using the method of Example 7 versus those assembled without the unfilled liquid curable material. Initially, 2 mm×2 mm silicon dies were coated with the epoxy/phenolic-containing underfill composition described in Example 1. The dies were B-staged at 125° C. under vacuum for 30 minutes to obtain a smooth, non-tacky coating on the surface of the dies. ½ inch×½ inch pieces of FR-4 substrate board were cut and pre-baked at 150° C. for 40 minutes to eliminate any moisture. In the first test method (Method I), a drop of the unfilled liquid curable material was put on the pre-baked FR-4 substrate pieces and the dies were placed face down on the substrate. In the second test method (Method II), the silicon dies were placed directly on the bare FR-4 substrate pieces without the unfilled curable material on the substrate. The assemblies prepared according to both methods were then passed through the reflow oven to form packages. It was observed in the packages formed according to Method II that the filled underfill material spread out along the edges of the die, but did not climb along the edges of the die to form a complete fillet. The dies prepared according to Method I formed a complete fillet around the chip boundary. The low-viscosity unfilled liquid curable material flowed nicely and climbed up along the edges of the chip to form the fillet. All chips were then tested via the Die Shear Test which records the highest force to shear the die from the FR-4 substrate. The peak shearing force was recorded by a Royce Instruments Die-Shear Tester. Twenty packages formed via each method were sheared and the average shear force was recorded. All the packages were found to fail at the chip/material A interface. The average peak force for the packages formed according to Method II was was 13.5±3.5 kgf. The average peak force for the packages formed according to Method I was 19.9±2.6 kgf. The peak force before failure for the packages formed according to Method A was found to be higher due to larger fillets formed with the aid of the unfilled material B. Thus, the adhesion is increased by around 25% by coating the chip and the substrate with the two different but compatible materials before attachment. As understood in the art, good wetting and adhesion between those materials, and well formed fillet are essential for reliability of the packages. The die shear results are shown in Table 5.

TABLE 5

Die Shearing Test Results

| | Force (kg/Peak Shear) |
|---|---|
| One Layer Package | 10-17 |
| Two-Layer Package (Filled B-Staged) | 17-22.5 |
| Two-Layer Package (Filled Layer Cured) | 2.5-7.5 |

EXAMPLE 9

The following example shows the effect of the type and loading of the catalyst on the curing behavior of the B-staged epoxy/phenolic coatings. The thermal curing profiles of the B-Staged coatings in DSC were used to prove the latent curing ability of the catalyst with the epoxy/phenolic system. To prepare the composition, 50 parts each (total parts 100) of EPON 826 (Resolution Performance Products) and HRJ 2190 (Schenectady International) were dissolved in 53 parts of propylene glycol ethyl methyl acetate (PGMEA—Aldrich Chemical) and heated at 140° C. for 2 hours. After cooling the homogeneous mixture to room temperature, 108 parts of FUSOFE (Admatechs), 0.5 parts of BYK-W 9010(BYK-Chemie), 0.5 parts of A-187 (Silquest), 1 part of epoxy/siloxane hybrid resin and 0.25 or 0.1 parts of a catalyst (as specified in Table 1) were added. All formulations were then mixed in a Double Planetary Ross mixer for 6 hours. The mixed underfill material was bubble free, did not trap air on slow shearing and had viscosity of 30 Pa-s (at shear rate of 1 $s^{-1}$).

To prepare for the curing study, the underfill materials were dispensed on glass cover-slips (25×25 mm), by a stenciling process, to get 110 micron thick coating. The B-Stage was done on a calibrated hot-plate, pre-heated to 135° C., for 15 minutes. After B-stage, all coatings were smooth, non-tacky and void free. These B-staged coatings were then used for the curing study.

The peak curing temperatures and the enthalpy of curing of these epoxy/phenolic systems (with different catalysts and loadings) recorded from the DSC curing profiles (ramped at 20° C./min.) after B-stage are given in Table 6. The DSC curing thermograms are shown in FIG. 1.

TABLE 6

Epoxy/Phenolic Formulations with different catalysts and catalyst levels

| Formula | EPON 826 | HRJ 2190 | 2P4MZ | 2P4MZ-PMDA adduct | AmiCure 2PIP | Curezol 17Z | Curing Peak (° C.) | Curing Enthalpy (J/g) | Cured Tg (° C.) |
|---|---|---|---|---|---|---|---|---|---|
| A1 | 50 | 50 | 0.25 | — | — | — | 178.7 | 50.5 | 119.8 |
| B1 | 50 | 50 | — | 0.25 | — | — | 196.3 | 94.1 | 110.5 |
| C1 | 50 | 50 | — | — | 0.25 | — | 201.3 | 88.0 | 110.9 |
| D1 | 50 | 50 | — | — | — | 0.25 | 204.8 | 89.6 | 113.2 |
| A2 | 50 | 50 | 0.1 | — | — | — | 177.7 | 75.5 | 111.3 |
| B2 | 50 | 50 | — | 0.1 | — | — | 219.0 | 89.6 | 105.0 |
| C2 | 50 | 50 | — | — | 0.10 | — | 210.4 | 101.7 | 101.8 |
| D2 | 50 | 50 | — | — | — | 0.10 | 253.9 | 120.5 | 112.6 |

As can be seen from Table 6, in formulations with 2P4MZ as catalyst (A1 & A2), curing peaks below the solder interconnection temperatures (183° C. for the traditional tin/lead solder and >217° C. or higher for tin/silver/copper alloys). This lower temperature curing builds up the underfill material viscosity and interferes with the solder joint formation. Although the curing peak does not change with 2P4MZ loading, the enthalpy of cure is much lower at 0.25% level. This suggests that, at 0.25% loading, significant advancement of the reaction takes place during the B-stage step. The significantly higher B-stage Tgs (see FIG. 1) recorded for A1 & A2 (compared to rest of the systems) also indicate more reaction during the B-stage step.

The other catalysts used in this example provide the latency for delayed curing. This delay in curing (compared to traditional 2P4MZ type imidazole curing agents) provides larger time window for the solder to flux and form interconnection before the underfill resin has cured. These latent catalysts include National Starch Proprietary 2P4MZ-PMDA adduct, Amicure 2PIP (Air Products Inc.) and Curezol 17Z (Air Products Inc.). When solder-bumped chips, coated with all these formulations (B1-D2) were assembled by passing through the standard solder-reflow process, good fluxing, reflow and interconnection of the solder bumps to the substrate were established. In case of the bumped chips coated with Formulations A1 & A2, the underfill material cured earlier and solder interconnection could not be achieved.

As the loading of these latent catalysts is reduced, the curing is delayed to still higher temperatures and the enthalpy of curing is also much higher. It suggests that any pre-curing during the B-stage can be minimized and the latent curing ability of catalyst can be exploited more efficiently at lower catalyst loadings. The compositions with different catalyst loading, and hence different curing profiles, can be selected for different types of solders (tin/lead eutectic or lead-free tin/silver/copper) accordingly.

We claim:

1. A method of preparing one or more silicon chips, comprising the steps of
   a) applying to a semiconductor wafer an encapsulant comprising a thermally curable admixture of an epoxy resin having an epoxy equivalent weight between 86 g/eg and 700 g/eg, a phenol-containing compound, an imidazole phosphate salt catalyst, and a fluxing agent;
   b) B-stage processing the encapsulant on the semiconductor wafer so that the encapsulant solidifies into a smooth, non-tacky coating; and
   c) dicing the semiconductor wafer into individual silicon chips.

2. The method of claim 1, wherein the encapsulant is applied to the semiconductor wafer via spin coating, screen printing or stencil printing.

3. A method of preparing an electronic package comprising the steps of
   a) applying to a semiconductor wafer an encapsulant comprising a thermally curable admixture of an epoxy resin having an epoxy equivalent weight between 86 g/eg and 700 g/eg, a phenol-containing compound, an imidazole phosphate salt catalyst, and a fluxing agent;
   b) B-stage processing the encapsulant on the semiconductor wafer so that the encapsulant solidifies into a smooth, non-tacky coating;
   c) dicing the semiconductor wafer into more than one silicon chip, with each chip having a first side coated with the encapsulant;
   d) placing one or more silicon chips on a substrate so that the first side of the silicon chip is adjacent to the substrate; and
   e) heating the substrate and at least one silicon chip to a temperature sufficient to form interconnections between the at least one silicon chip and the substrate and cure the encapsulant.

4. The method of claim 3, comprising the additional step of placing an unfilled liquid curable fluxing material on the substrate before the silicon chip is placed on the substrate.

5. The encapsulant of claim 1, wherein the imidazole phosphate salt comprises 2-phenylimidazole dihydrogen phosphate salt.

6. The encapsulant of claim 5, wherein the imidazole phosphate salt comprises a phosphoric acid component.

* * * * *